United States Patent [19]

Zumsteg

[11] 4,345,221
[45] Aug. 17, 1982

[54] TEMPERATURE COMPENSATED SIGNAL GENERATOR INCLUDING TWO CRYSTAL OSCILLATORS

[75] Inventor: Alphonse Zumsteg, Solothurm, Switzerland

[73] Assignee: Societe Suisse pour l'Industrie Horlogere Management Services S.A., Bienne, Switzerland

[21] Appl. No.: 150,107

[22] Filed: May 15, 1980

[30] Foreign Application Priority Data

May 22, 1979 [CH] Switzerland ............... 4783-79

[51] Int. Cl.³ ................. H03B 5/04; H03B 5/32
[52] U.S. Cl. ........................... 331/176; 331/37; 331/46; 331/158
[58] Field of Search .............. 331/37, 38, 39, 40, 331/41, 42, 43, 162, 176, 46; 368/159, 158

[56] References Cited

U.S. PATENT DOCUMENTS

| 3,978,650 | 9/1976 | Hashimoto et al. | 331/176 X |
| 4,071,797 | 1/1978 | Zumsteg et al. | 310/361 |
| 4,159,622 | 7/1979 | Akahane | 331/176 X |

FOREIGN PATENT DOCUMENTS

| 453223 | 6/1968 | Switzerland | 331/176 |
| 2004155 | 3/1979 | United Kingdom | 331/176 |

OTHER PUBLICATIONS

Brunner, "Wide-Range Temperature Compensation by Addition of Two Crystal-Resonator Frequencies", Electronics Letters, Vol. 11, Jul. 10, 1975, pp. 304-305.

Primary Examiner—Siegfried H. Grimm
Attorney, Agent, or Firm—Wender, Murase & White

[57] ABSTRACT

A signal generator having a digital temperature compensation circuit contains high and low frequency quartz oscillators (HF and NF), the low frequency oscillator being used for temperature compensation. Both oscillators are manufactured such that the descending portion of the temperature dependent parabolic frequency curve of the low frequency oscillator passes through the temperature inversion point of the parabola of the high frequency oscillator.

The frequencies of both oscillators are first adjusted such that the ratio thereof is inversely proportional to the ratio of the parabolic temperature coefficient, i.e., $f_1:f_2=\beta_2:\beta_1$. Subsequently two substantially identical reference frequencies are adjusted and, by feeding back the output frequency, combined in such a manner that an output frequency independent of temperature is produced which is determined substantially by the high frequency oscillator. The signal generator is thus temperature compensated and, due to the use of a high frequency oscillator, has much better properties with regard to aging and frequency stability than a low frequency oscillator.

7 Claims, 5 Drawing Figures

FIG.1
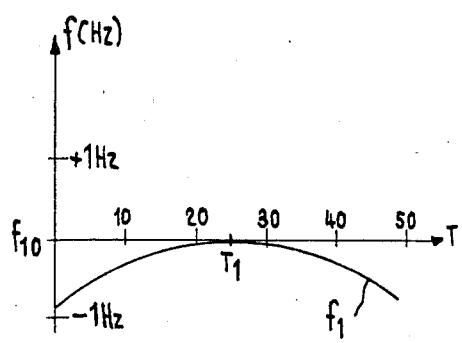
FIG.2
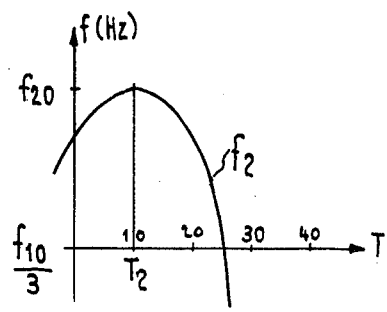
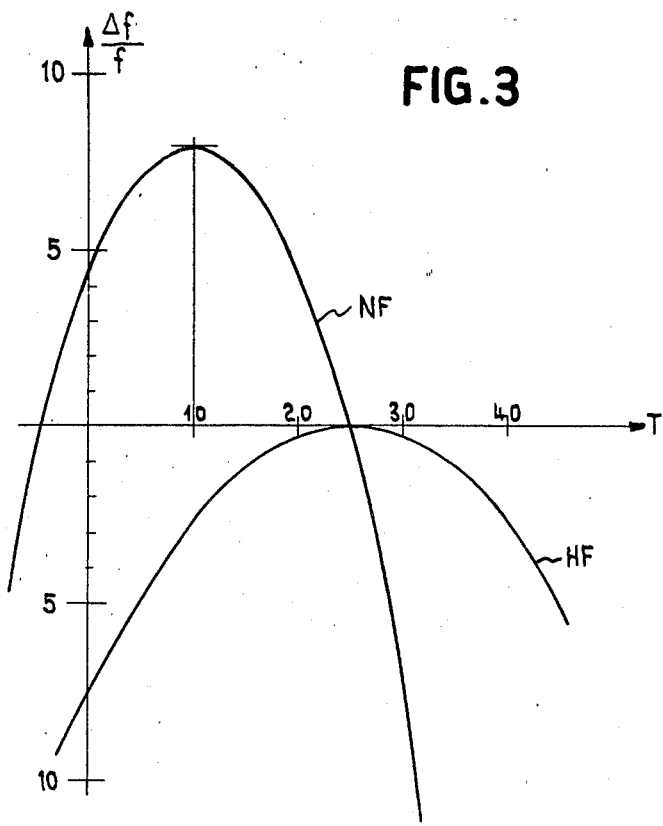
FIG.3

TEMPERATURE COMPENSATED SIGNAL GENERATOR INCLUDING TWO CRYSTAL OSCILLATORS

BACKGROUND OF THE INVENTION

The present invention concerns a temperature compensated signal generator utilising a second quartz oscillator.

A signal generator with digital temperature compensation is proposed and described in the U.K. Patent Application No. 2,004,155.

Two low frequency oscillators with a frequency of 32 kHz, typical for watch circuits, are used therein having as far as possible the same quadratic temperature coefficients and different inversion temperatures. Whilst the temperature compensation can be more accurate by use of a second quartz crystal oscillator in such a circuit than with the use of other components such as capacitors, resistors or semiconductor devices, it is in the nature of low frequency quartz crystal oscillators that aging is considerable, whereby the advantage achieved is reduced in the long term.

It is therefore the object of the present invention to offer a signal generator with temperature compensation which is prone to far less aging and has higher frequency stability.

SUMMARY OF THE INVENTION

According to the present invention, there is provided a signal generator with temperature compensation by means of a second quartz crystal oscillator, wherein the signal generator contains a high-frequency and a low frequency quartz oscillator, the frequencies of which have a parabolic temperature dependence different from each other, and which are adjusted to each other so that the descending portion of the relative frequency change ($\Delta f/f$) of the low frequency oscillator passes through the temperature reversing point of the relative frequency change ($\Delta f/f$) of the high frequency oscillator and the temperature compensation circuit is designed so that the high frequency oscillator is time defining.

BRIEF DESCRIPTION OF THE DRAWINGS

The present invention will now be described further, by way of example, with reference to the accompanying drawings, in which:

FIG. 1 is a graph showing the parabolic temperature behaviour of a high frequency oscillator after division of its frequency;

FIG. 2 is a graph showing the parabolic temperature behaviour of a low frequency oscillator;

FIG. 3 is a graph showing the parabolic temperature behaviour of the oscillators according to FIGS. 1 and 2 in a particular arrangement;

DETAILED DESCRIPTION

It is known that by using high frequency oscillators having a frequency of 4.2 MHz, the quartz crystals of such oscillators having a particular section cut according to U.S. Pat. No. 4,071,797, aging is substantially less than in the case of low frequency oscillators, so that temperature compensation and frequency determination, in which the high frequency oscillator is decisive, have better short term and, moreover, better long term properties.

FIG. 1 illustrates the parabolic temperature behavior of a high frequency oscillator after division to 96 kHz and FIG. 2 shows the parabolic temperature behavior of a traditional low frequency oscillator using a frequency of 32 kHz, in which:

$$f_1(T) = f_{10}(1 + \beta_1(T-T_1)^2 + \gamma(T-T_1)^3)$$

and $$f_2(T) = f_{20}(1 + \beta_2(T-T_2)^2),$$

wherein $T_1$, $T_2$ are the inversion temperatures, $f_{10}$, $f_{20}$ the rated frequencies at the inversion temperatures, $\beta_1 = -1.2 \cdot 10^{-8}/(°C.)^2$ the quadratic or parabolic temperature coefficient for the high frequency oscillator, $\beta_2 = -3.6 \cdot 10^{-8}/(°C.)^2$ the parabolic temperature coefficient of the low frequency quartz, and $\gamma$ the cubic temperature coefficient.

For the following example the influence of $\gamma$ is neglected.

In order to carry out the temperature compensation of the present invention, the oscillators according to FIG. 3 are adjusted so that one branch of the relative frequency change of the low frequency oscillator passes through the temperature inversion point ($T_1$) of the relative frequency change of the high frequency oscillator; this means that:

$$f_1(T_1) = 3 \cdot 2^{15} \text{ Hz} (96 \text{ kHz})$$

and $$f_2(T_1) = 2^{15} \text{Hz} (32 \text{ kHz})$$

In other words, the ratio of f1:f2 must behave like $\beta_2:\beta_1$. This follows from the condition that $f_1 - f_2$ should have no quadratic temperature dependence. If this difference is calculated according to the above equations, then the result for the quadratic temperature component is $$(f_{10}\beta_1 - f_{20}\beta_2)T^2 = 0$$

From this follows $(f_{10}/f_{20}) = (\beta_2/\beta_1)$ and thus $f_1 = 3f_2$

Figure 4:
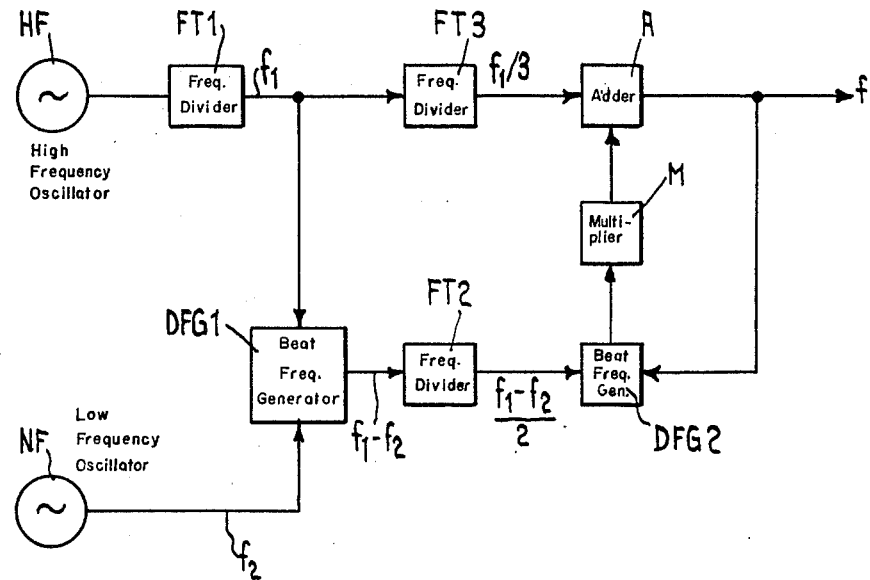
FIG. 4 shows a temperature compensation circuit.

On the basis of two oscillators adjusted in this manner, it is the object of the temperature compensation circuit shown in FIG. 4 to link the output frequencies $f_1$ and $f_2$ of both oscillators in such manner that an output frequency f, independent of the temperature, results. According to a preferred embodiment, a crystal controlled oscillator HF delivers a high frequency signal to frequency divider FT1 so as to produce frequency $f_1$ of 96 KHZ; a second crystal controlled oscillator NF delivers a low frequency signal $f_2$ of 32 KHz. Signals $f_1$ and $f_2$ are combined to result in a difference frequency $f_1 - f_2 = 64$ kHz which is produced in a first beat frequency generator DFG1 and is halved in a frequency divider FT2.

In another frequency divider FT3, $f_1$ is reduced to 32 kHz; this frequency, $f_1/3$, originates from the high frequency oscillator delivering the uncorrected output frequency. Subsequently, in another beat frequency generator DFG2, the difference between $$\frac{f_1 - f_2}{2}$$

and the output frequency f is formed and subsequently squared in a circuit M and multiplied with a constant factor k and then, in an addition circuit A is added to the frequency ($f_1/3$) in order finally to yield an output frequency $$f = \frac{f_1}{3} + k\left[\frac{f_1 - f_2}{2} - f\right]^2$$

The feedback and subtraction of the temperature independent output frequency f from the halved difference frequency gives a frequency which is linearly dependent on the temperature, and the value of which amounts to 0 Hz at the inversion temperature $T_1$. f is given by:

$$f = \frac{f_1 - f_2}{2} + \frac{1}{2k} \pm \frac{\sqrt{2k(f_1/3 - f_2) + 1}}{2k}$$

or, since only the minus sign can apply $$f = \frac{f_1 - f_2}{2} + \frac{1 - \sqrt{1 + 2k(f_1/3 - f_2)}}{2k}$$

Thus for f to become temperature independent, k must, in this example, assume the following value:

$$k = \frac{(\beta_1 - \beta_2) \, 3}{2 f_{10} \beta_2^2 (T_1 - T_2)^2}$$

If the already stated values are inserted in the equations, it will be seen that, on the one hand, the influence of the correcting component is very slight, so that the frequency originating from the high frequency resonator remains decisive and, on the other hand, the output frequency has become temperature independent.

For digital temperature compensation it may happen that with the direct feedback of the output frequency, this loop is blocked.

Figure 5:
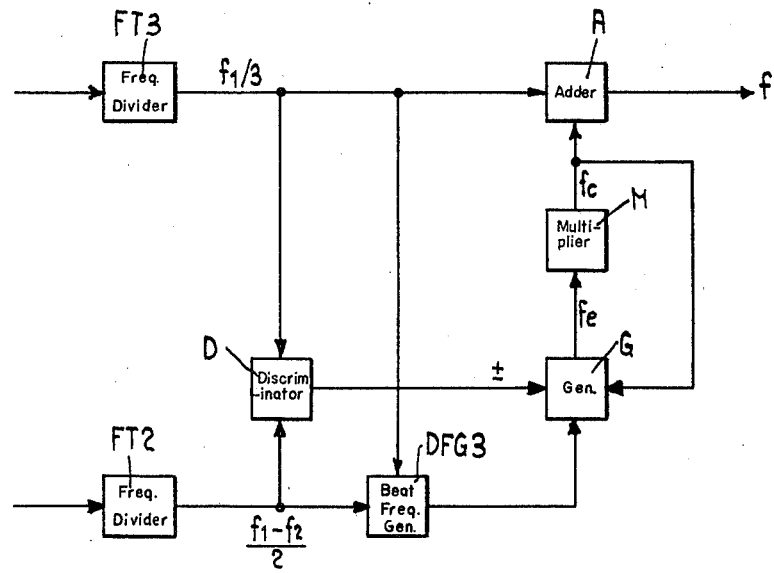
FIG. 5 shows a digital temperature compensation circuit.

If temperature compensation is effected digitally, it is an advantage, as shown in FIG. 5, to feedback the correcting frequency $f_c$ output from the circuit M. The temperature compensation obtained according to the circuit in FIG. 5 is the same as in the preceding embodiment, for $$f = \frac{f_1}{3} + f_c \text{ and } f_e = \frac{f_1 - f_2}{2} - f =$$

$$\frac{f_1 - f_2}{2} - \left[\frac{f_1}{3} + f_c\right] = \frac{f_1 - f_2}{2} - \frac{f_1}{3} - f_c$$

The subtraction is therefore effected in two steps. First, the frequency $f_1/3$, originating from the frequency divider FT3 as shown in FIG. 4, is subtracted from the frequency, $$\frac{f_1 - f_2}{2},$$

produced by the frequency divider FT2 as shown in FIG. 4, in the beat frequency generator DFG3 and this difference passes into the generator G in which the fed back correcting frequency $f_c$ is either subtracted or added. This depends on whether the absolute value of the difference of both said frequencies is greater or smaller than zero. i.e.

$$f_e = \left|\frac{f_1 - f_2}{2} - \frac{f_1}{3}\right| - f_c, \text{ when } \frac{f_1 - f_2}{2} - \frac{f_1}{3} > 0$$

$$f_e = \left|\frac{f_1 - f_2}{2} - \frac{f_1}{3}\right| + f_c, \text{ when } \frac{f_1 - f_2}{2} - \frac{f_1}{3} < 0$$

The sign is determined by the discriminator D which gives a corresponding signal to the generator.

The output of the generator G passes into the circuit M with the already described function, from which the signal passes to the addition circuit A, is added there to $f_1/3$ in order to finally give the desired output frequency f. In this case also, it is proposed by suitable measures that the feedback loop should not be blocked.

The sign from the discriminator D can also be used to change the coefficient k within certain limits so that in the first approximation the influence of the 3rd order member $\gamma$ can be corrected.

The above equations may of course be generalised and used accordingly for other values.

Owing to the comparatively high current consumption of the high frequency oscillator relative to a low frequency oscillator it may be necessary to change it more frequently in view of the batteries obtainable at present, and it is therefore desirable to reduce the current consumption. In U.S. Patent Application Ser. No. 126,154 of the same applicant, a circuit is offered in which the high frequency oscillator is switched on only periodically, so that the current consumption of the entire system is only slightly above that of the low frequency oscillator. On the basis of the present circuit and that of the above mentioned earlier application it is therefore possible for a person skilled in the art to offer a combination in which a high frequency and a low frequency oscillator produce an almost temperature independent frequency and the high frequency oscillator is switched on only periodically in order to greatly reduce current consumption. Again, in this combined circuit, the high frequency oscillator, with its better frequency stability and aging properties, is the decisive element whilst the negative influence of the other oscillator remains slight.

It should be appreciated that the invention described herein is not limited to the values stated of 32 kHz, on the one hand, and 4.2 MHz, on the other hand, since oscillators having other frequencies may also be used, the above equations being applied accordingly.

The above described signal generator may be used in wherever high accuracy, favorable temperature compensation and long term operation is desired and where the volume available for the signal generator is limited. This applies, for example, in the case of a wrist watch or a film camera.

I claim:

1. A generator for producing a temperature compensated output signal, comprising:
   a high frequency crystal oscillator having a first parabolic temperature dependency;
   a low frequency crystal oscillator having a second parabolic temperature dependency different from said first dependency and characterized by a descending portion coinciding with an apex of said first dependency;
   means connected to said high and low frequency oscillators for producing a first intermediate signal and a second intermediate signal substantially equal in frequency to said first intermediate signal; and
   means receiving said first and second intermediate signals for producing the output signal such that the output signal is independent of temperature variations.

2. A signal generator as recited in claim 1, wherein said output signal producing means includes means for combining the output signal and said second intermediate signal to produce a compensation signal, and means for adding said compensation signal with said first intermediate signal to produce the output signal.

3. A signal generator as recited in claim 2 wherein said combining means includes a beat frequency generator producing a signal at a frequency corresponding to the difference between said second intermediate signal and the output signal, and a multiplier circuit squaring the frequency of said difference signal and multiplying said squared frequency by a predetermined constant, thereby producing said compensating signal.

4. A signal generator as recited in claim 1 wherein said intermediate signal producing means includes a frequency divider coupled to said high frequency oscillator for producing said first intermediate signal, and a beat frequency generator connected to said high and low frequency oscillators to produce said second intermediate signal.

5. A signal generator as recited in claim 1, wherein said receiving means includes a beat frequency generator receiving said first and second intermediate signals, means connected to said beat frequency generator and receiving said first and second intermediate signals for producing a compensation signal, and means for adding said compensation signal to said first intermediate signal to produce the output signal.

6. A signal generator as recited in claim 5, wherein said compensation signal producing means includes a discriminator for producing a control signal in response to said first and second intermediate signals, means coupled to said discriminator and to said beat frequency generator for selectively combining, in response to said control signal, said compensation signal with a difference signal output by said beat frequency generator, and a multiplier circuit coupled to said combining means for producing said compensation signal.

7. A signal generator as recited in claim 1, wherein said high frequency oscillator has an oscillating frequency of 4.2 Mhz, and said low frequency oscillator has an oscillating frequency of 32 kHz.

* * * * *